(12) United States Patent
Yashiki et al.

(10) Patent No.: US 11,329,598 B2
(45) Date of Patent: May 10, 2022

(54) POWER GENERATING DEVICE AND POWER GENERATING MODULE

(71) Applicant: Mitsubishi Electric Corporation, Chiyoda-ku (JP)

(72) Inventors: Yasutoshi Yashiki, Chiyoda-ku (JP); Takayuki Morioka, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 248 days.

(21) Appl. No.: 16/485,344

(22) PCT Filed: Mar. 27, 2018

(86) PCT No.: PCT/JP2018/012505
§ 371 (c)(1),
(2) Date: Aug. 12, 2019

(87) PCT Pub. No.: WO2018/190120
PCT Pub. Date: Oct. 18, 2018

(65) Prior Publication Data
US 2020/0028464 A1    Jan. 23, 2020

(30) Foreign Application Priority Data

Apr. 11, 2017  (JP) .............................. JP2017-078273

(51) Int. Cl.
*H02S 10/20*      (2014.01)
*H02N 1/00*       (2006.01)
*H01L 31/0224*    (2006.01)
*H02M 3/00*       (2006.01)
*H02M 7/06*       (2006.01)

(52) U.S. Cl.
CPC .............. *H02S 10/20* (2014.12); *H02N 1/00* (2013.01); *H01L 31/022441* (2013.01); *H02M 3/00* (2013.01); *H02M 7/06* (2013.01)

(58) Field of Classification Search
CPC ... H02S 10/20; H02N 1/00; H01L 31/022441; H02M 3/00; H02M 7/06
See application file for complete search history.

(56) References Cited

U.S. PATENT DOCUMENTS

| | | | |
|---|---|---|---|
| 2013/0241346 A1* | 9/2013 | Boisseau ................. | H02N 1/08 310/300 |
| 2016/0118514 A1* | 4/2016 | Li .................. | H01L 31/022425 136/244 |

FOREIGN PATENT DOCUMENTS

| | | |
|---|---|---|
| JP | 2009-291020 A | 12/2009 |
| JP | 2012-21 0076 A | 10/2012 |
| JP | 2016-86117 A | 5/2016 |

OTHER PUBLICATIONS

International Search Report dated Jun. 26, 2018 in PCT/JP2018/012505 filed Mar. 27, 2018.

* cited by examiner

*Primary Examiner* — Carlos Amaya
(74) *Attorney, Agent, or Firm* — Xsensus LLP

(57) ABSTRACT

A power generating device includes: a photoelectric conversion unit having a photoelectric conversion film; an electret layer for holding electric charges; an electret power generator configured of a light transmissive material; and an insulating layer which is covering a photoelectric conversion film and transmits light in all wavelength bands available for the photoelectric conversion film or some of the all wavelength bands. The electret layer is stacked on the insulating layer.

10 Claims, 12 Drawing Sheets

POWER GENERATING DEVICE AND POWER GENERATING MODULE

TECHNICAL FIELD

The present invention relates to a power generating device and a power generating module, and more particularly, to a power generating device which converts kinetic energy and light energy into power and a power generating module which includes such a power generating device.

BACKGROUND ART

Conventionally, power generating devices are known which are capable of converting multiple kinds of energies, obtained from the surrounding environment, into electrical energy. Among these power generating devices, some are known to be capable of storing power from any of the multiple kinds of energies even if supply of any other of the energy sources fails (e.g., see PTLs 1 and 2).

A technology has also been reported which strengthens the built-in electric field of the P-N junction of a photoelectric conversion element by disposing an electret layer, which has positive or negative surface charge, on the periphery or side of an electrode to improve the characteristics of the photoelectric conversion element, thereby widening the depletion layer (e.g., see PTL 3)

CITATION LIST

Patent Literature

PTL 1: Japanese Patent Laying-Open No. 2012-210076
PTL 2: Japanese Patent Laying-Open No. 2009-291020
PTL 3: Japanese Patent Laying-Open No. 2016-86117

SUMMARY OF INVENTION

Technical Problem

However, PTLs 1 and 2 require disposing multiple power generating devices separately and connecting them to a control circuit in order to incorporate them into a power generating module, which ends up increasing the size of the power generating module.

Moreover, according to the disclosure of PTL 3, in the photoelectric conversion element, the band structure does not vary sufficiently to reduce the surface recombination velocity that is much quicker than the recombination velocity within the P-N junction.

The present invention is made to solve problems as the above, and an object of the present invention is to provide a power generating device which is capable of utilizing multiple kinds of energy sources as input energy and inhibiting the power generating device from increasing in size, and a power generating module which includes such a power generating device.

Solution to Problem

A power generating device according to the present invention includes: a photoelectric conversion unit having a photoelectric conversion film; an electret power generator formed of a light transmissive material and having an electret layer for holding electric charges; and an insulating layer which is covering the photoelectric conversion film and transmits light in all wavelength bands available for the photoelectric conversion film or some of the all wavelength bands. The electret layer is stacked on the insulating layer.

Advantageous Effects of Invention

According to the power generating device of the present invention, since the electret layer and the photoelectric conversion film are stacked, the power generating device can be inhibited from increasing in size. Moreover, the power generating device according to the present invention can, since it includes the photoelectric conversion unit and the electret power generator, utilize oscillation energy and light energy.

DESCRIPTION OF EMBODIMENTS

Next, embodiments of the present invention will be described, with reference to the accompanying drawings.

Embodiment 1

Figure 1:
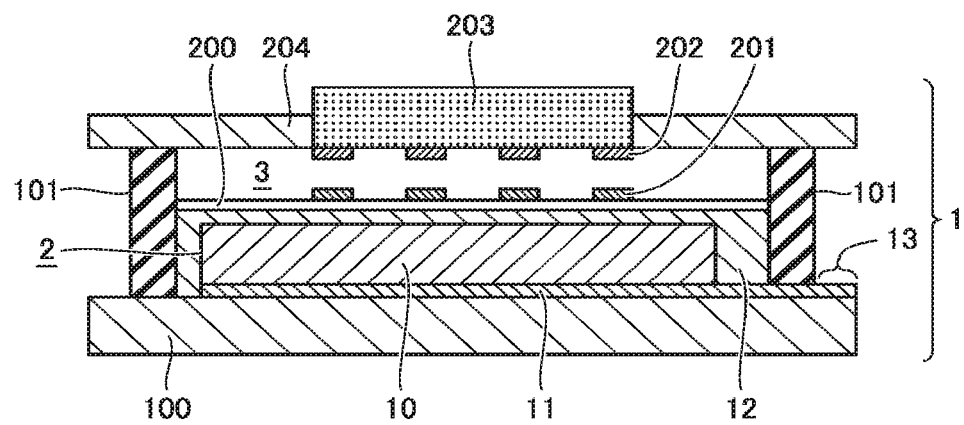
FIG. 1 is a cross section of a power generating device according to Embodiment 1.

FIG. 1 is a cross section of a power generating device 1 according to Embodiment 1.

As shown in FIG. 1, power generating device 1 includes a fixing member 100, a spring 204, a support 101, a photoelectric conversion unit 2, an electret power generator 3, and an insulating layer 12.

Photoelectric conversion unit 2 includes a photoelectric conversion film 10 and an electrode 11. Photoelectric conversion unit 2 is a back contact solar cell.

Electret power generator 3 includes an electret layer 200, a first transparent electrode 201, a second transparent electrode 202, and a light-transmissive movable substrate 203. Electret power generator 3 is an electrostatic induction power generation element.

An electrode 11 is disposed on fixing member 100. A surface (back surface) of photoelectric conversion film 10 is in contact with electrode 11, the surface being opposite the surface (front surface) for receiving light such as sunlight. Photoelectric conversion film 10 is covered with insulating layer 12. Insulating layer 12 transmits the light in all wavelength bands that are available for photoelectric conversion film 10 or some of the all wavelength bands. Insulating layer 12 is formed by silicon oxide, aluminum oxide, silicon nitride, or a multilayer film thereof. Electret layer 200 is formed on the outermost surface of insulating layer 12.

First transparent electrode 201 is disposed on electret layer 200. Second transparent electrode 202 is disposed on light-transmissive movable substrate 203. Light-transmissive movable substrate 203 is disposed so that second transparent electrode 202 faces first transparent electrode 201 with a space inbetween. Light-transmissive movable substrate 203 is connected to support 101 via spring 204 on both sides. Support 101 supports light-transmissive movable substrate 203 so that first transparent electrode 201 and second transparent electrode 202 do not come into contact.

Electret layer 200 is formed by, for example, an organic insulating material, such as polycarbonate, polypropylene, polytetrafluroethylene, or amorphous fluoro resin, or an inorganic insulating material such as silicon dioxide. These materials are light transmissive, and thus do not reduce the output of photoelectric conversion unit 2 even if they are disposed on the incident light side of photoelectric conversion unit 2. The aforementioned material of electret layer 200 is implanted with positive or negative electric charges by corona discharge, etc., thereby allowing electret layer 200 to keep the electric charges within the layer.

Spring 204 is formed of, for example, an organic insulating material such as polycarbonate, polypropylene, polytetrafluroethylene, or amorphous fluoro resin. Desirably, spring 204 is formed of a material that is light transmissive and has a strength enough to serve as a crosslinked structure by itself.

Figure 2:
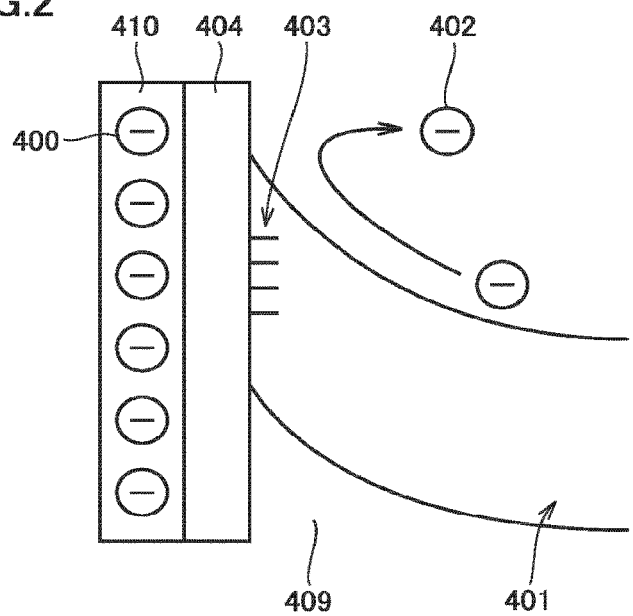
FIG. 2 is a diagram illustrating effects of interfacial fixed charge on the surface of a photoelectric conversion film.

FIG. 2 is a diagram illustrating effects of interfacial fixed charge on the surface of photoelectric conversion film 10.

Here, by way of example, a case is described in which an insulating layer 404, such as silicon dioxide, aluminum oxide, or silicon nitride, is formed on a photoelectric conversion film 409 formed of p-type crystalline silicon and an electret layer 410 having fixed negative electric charges is formed on insulating layer 404.

Numerous number of interface recombination levels 403 are present at the interface of photoelectric conversion film 409. If a large number of electrons 402 or holes are present in photoelectric conversion film 409, they recombine via interface recombination levels 403 and cause the open-circuit voltage or short-circuit current to decrease. Recombination velocity S at this time is represented by Equation (1). Here, n_s, p_s are electron density and the hole density at the interface, n_1, p_1 are electron electrons and the hole density at a certain energy position, n_i is intrinsic carrier density, v_th is thermal velocity of carriers, D_it is surface defect density, E_t is energy position, and σ_s, σ_s are electron and hole capture cross-sections.

[MATH 1]

$$S = \frac{(n_s p_s - n_i^2) v_{th}}{\Delta n} \times \int_{E_i}^{E_c} \frac{D_{it}(E_t) dE_t}{(n_s + n_1(E_t))\sigma_p^{-1} + (p_s + p_1(E_t))\sigma_n^{-1}} \quad (1)$$

It can be seen from Equation (1) that, in order to reduce recombination velocity S, the surface defect density D_it needs to be reduced or concentrations n_s, p_s of minority carriers present needs to be reduced.

As shown in FIG. 2, an electric field is generated near the surface of photoelectric conversion film 409 due to the presence of fixed electric charge 400, which bends a band structure 401 at the edge of photoelectric conversion film 409. As a result, electrons present at the edge of photoelectric conversion film 409 are pushed back into photoelectric conversion film 409 due to the bending of band structure 401. This can decrease the interface recombination velocity.

Figure 3:
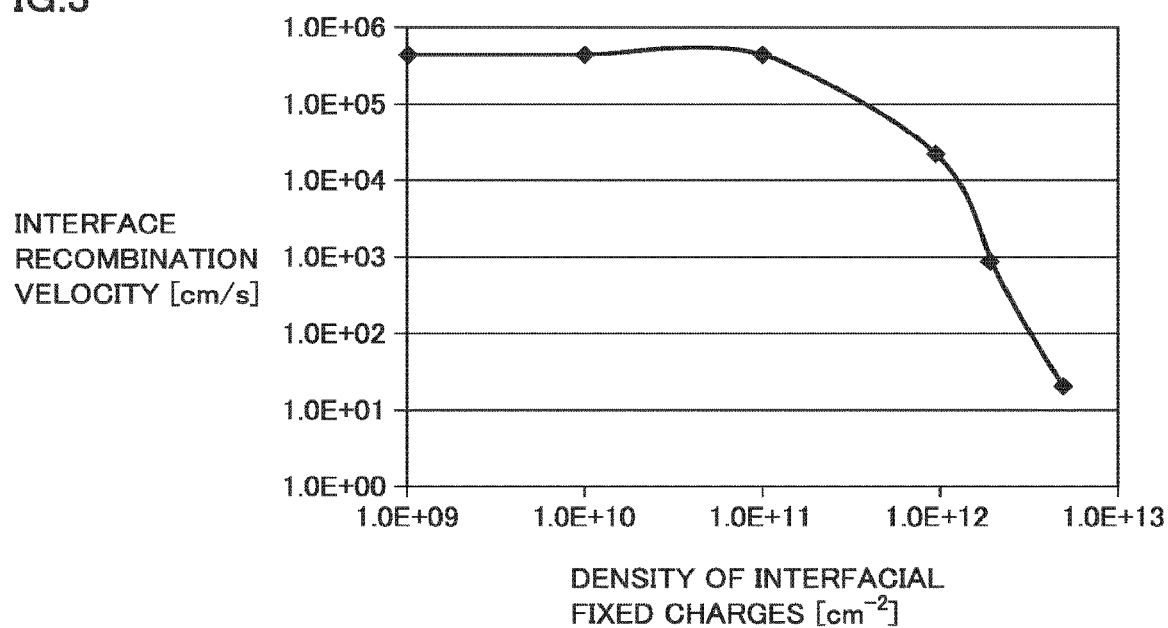
FIG. 3 shows the interfacial fixed charge versus interface recombination velocity.

FIG. 3 represents the interfacial fixed charge versus the interface recombination velocity. As shown in FIG. 3, it can be seen that as the density of interfacial fixed charges exceeds $1.0 \times 10^{11}$ cm$^{-2}$, the interface recombination velocity decreases.

While PTL 3 has reported the technology of strengthening the built-in electric field at the P-N junction of the photoelectric conversion element by disposing, on the periphery or side of an electrode of the photoelectric conversion element, an electret layer that has a density of surface charge in a range from −0.2 mC/m$^2$ to −2.1 mC/m$^2$, thereby widening the depletion layer. The density of surface charge disclosed in PTL 3 is, however, about $1.0 \times 10^9$ cm$^{-2}$ in terms of the density of interfacial fixed charges, which is insufficient to decrease the interface recombination velocity in the manner as the present embodiment does.

Next, effects of decreasing the interface recombination velocity will be described.

Figure 4:
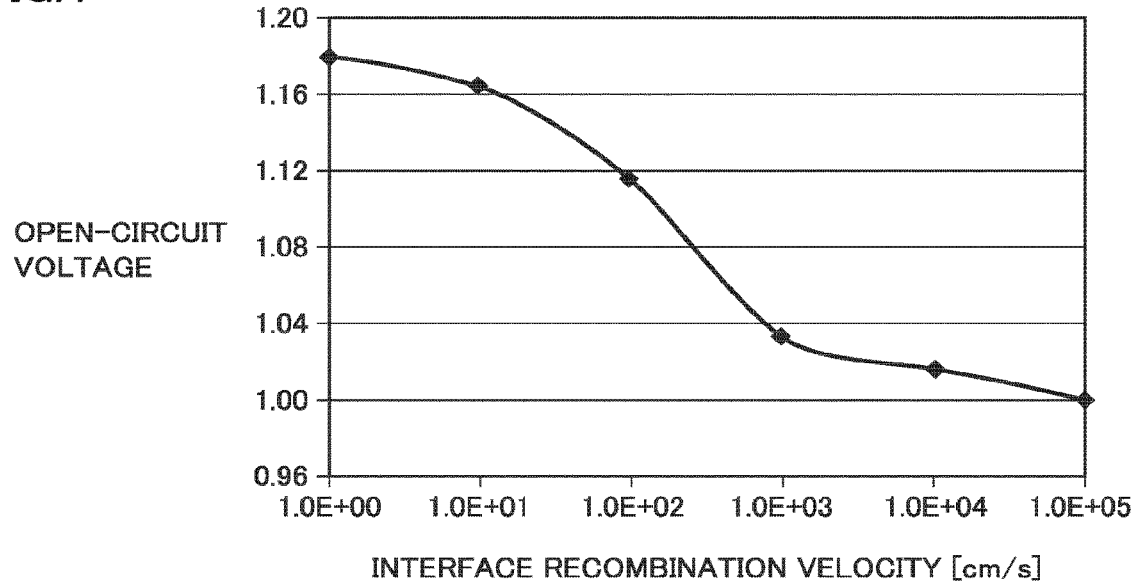
FIG. 4 shows the interface recombination velocity versus open-circuit voltage of a photoelectric conversion unit.
Figure 5:
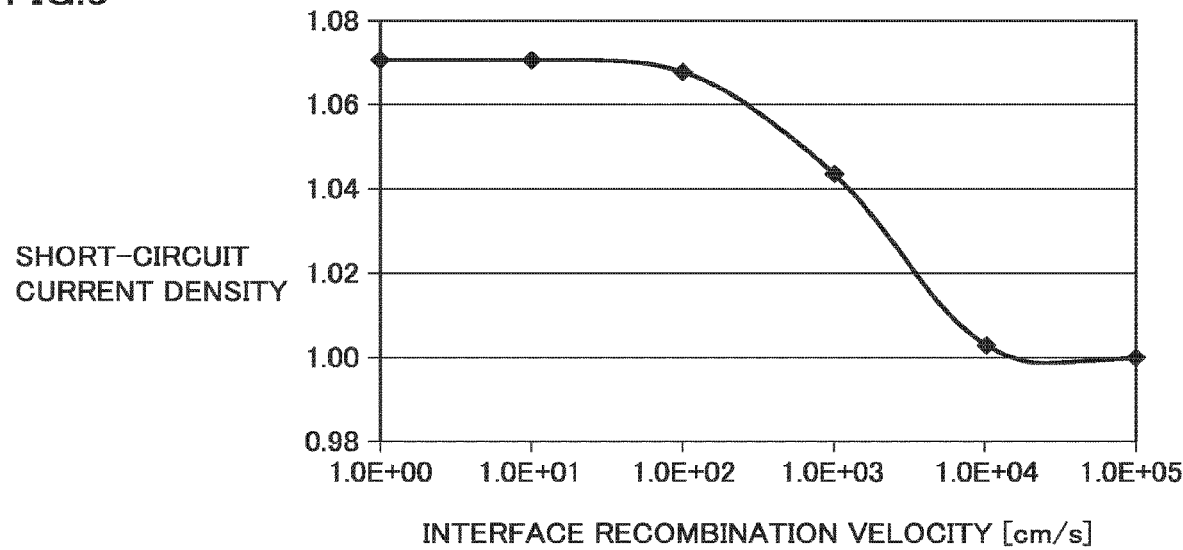
FIG. 5 shows the interface recombination velocity versus short-circuit current density.

FIG. 4 shows the interface recombination velocity versus the open-circuit voltage of photoelectric conversion unit 2. FIG. 5 shows the interface recombination velocity versus the short-circuit current density. In these figures, for ease of understanding, the open-circuit voltage and the short-circuit current density are normalized based on values thereof when the interface recombination velocity is $1 \times 10^5$ cm/s.

It can be seen that the open-circuit voltage and the short-circuit current density both increase in value with a decrease of the interface recombination velocity. Improvement of the short-circuit current density is no longer observed when the interface recombination velocity is $1 \times 10^2$ cm/s or less. From these results, the density of interfacial fixed charges of electret layer 200 is desirably $1.0 \times 10^{11}$ cm$^{-2}$ or greater.

Next, optical effects caused by disposing electret layer 200 above the photoelectric conversion unit 2 will be described.

Figure 6:
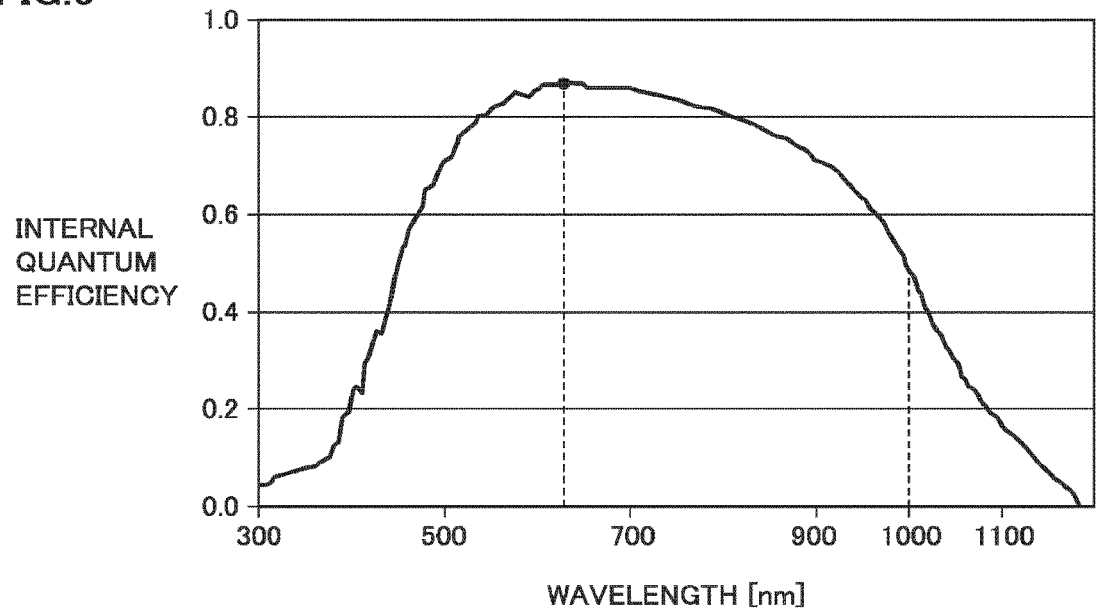
FIG. 6 is a diagram showing an example of internal quantum efficiency of a photoelectric conversion film formed of crystalline silicon.

FIG. 6 is a diagram showing an example of the internal quantum efficiency of a photoelectric conversion film formed of crystalline silicon. The internal quantum efficiency rises at a wavelength of 300 nm and reaches the maximum value at a wavelength of around 600 nm. The internal quantum efficiency decreases at a wavelength of 1000 nm or greater.

Figure 7:
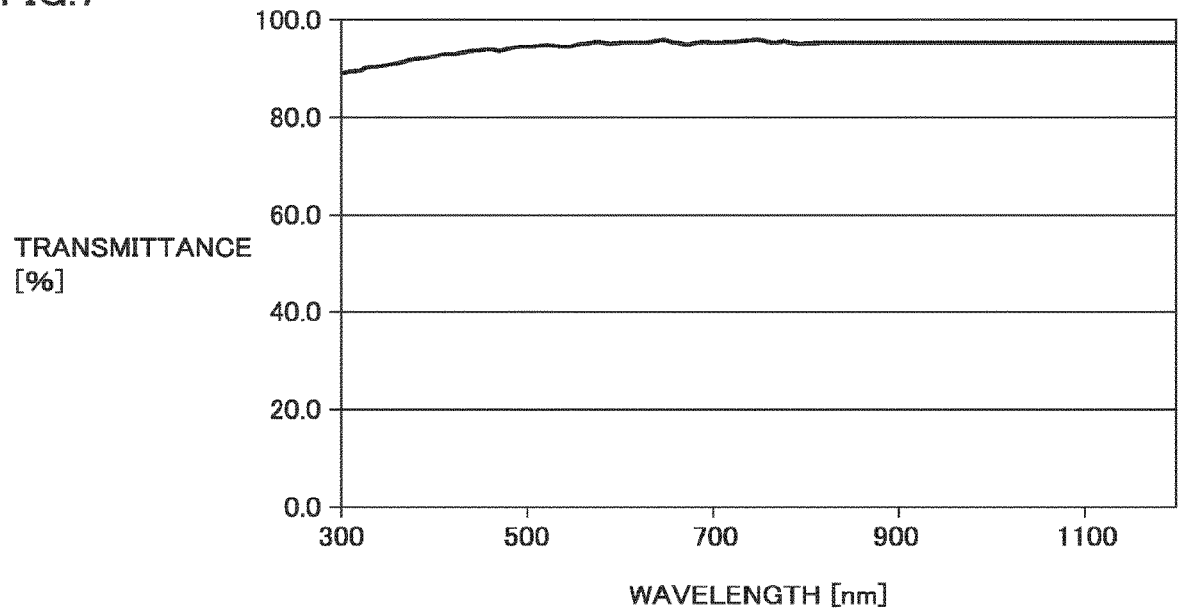
FIG. 7 is a diagram showing the transmittance of an amorphous fluoro resin having a thickness of 200 μm.

FIG. 7 is a diagram showing the transmittance of an amorphous fluoro resin having a thickness of 200 µm. The transmittance is maintained at 90% or greater at a wavelength of 300 nm or greater. The transmittance is at least 95%, particularly when wavelength is 600 nm or greater where the quantum efficiency of the photoelectric conversion film is high.

Figure 8:
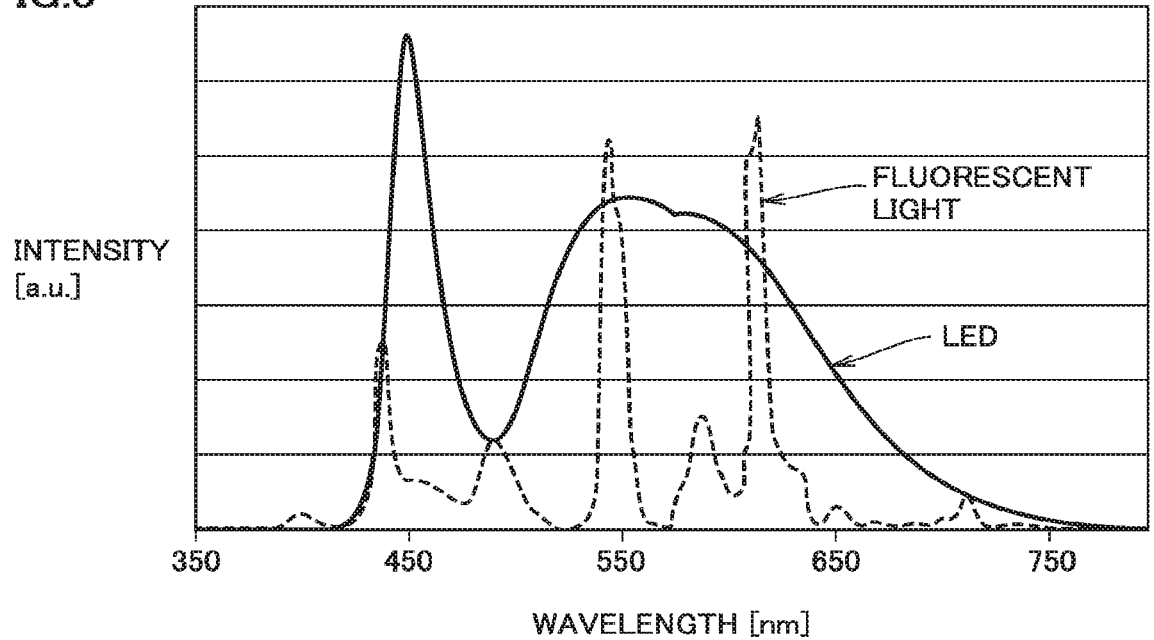
FIG. 8 is a diagram showing optical spectral distributions of light included in light of a fluorescent light and a white LED which are widely used for room illumination.

FIG. 8 is a diagram showing optical spectral distributions of a fluorescent light and a white LED (Light Emitting Diode) which are widely used for room illumination. Light emitted by both of the lights each primarily have a wavelength of 400 nm to 700 nm, which is sufficient to transmit through the amorphous fluoro resin. Light having an increased strength can be allowed to transmit through the amorphous fluoro resin by configuring electret layer 200 with a thickness of about 100 nm to about 200 µm.

Referring again to FIG. 1, first transparent electrode 201 is formed on electret layer 200. First transparent electrode 201 can be formed by depositing or sputtering a light-transmissive metallic oxide, such as zinc oxide, tin oxide, indium oxide, or gallium oxide onto electret layer 200, and patterning the light-transmissive metallic oxide. Alternatively, first transparent electrode 201 can be formed to have a desired shape at a deposition phase using, for example, a metal mask.

Figure 9:
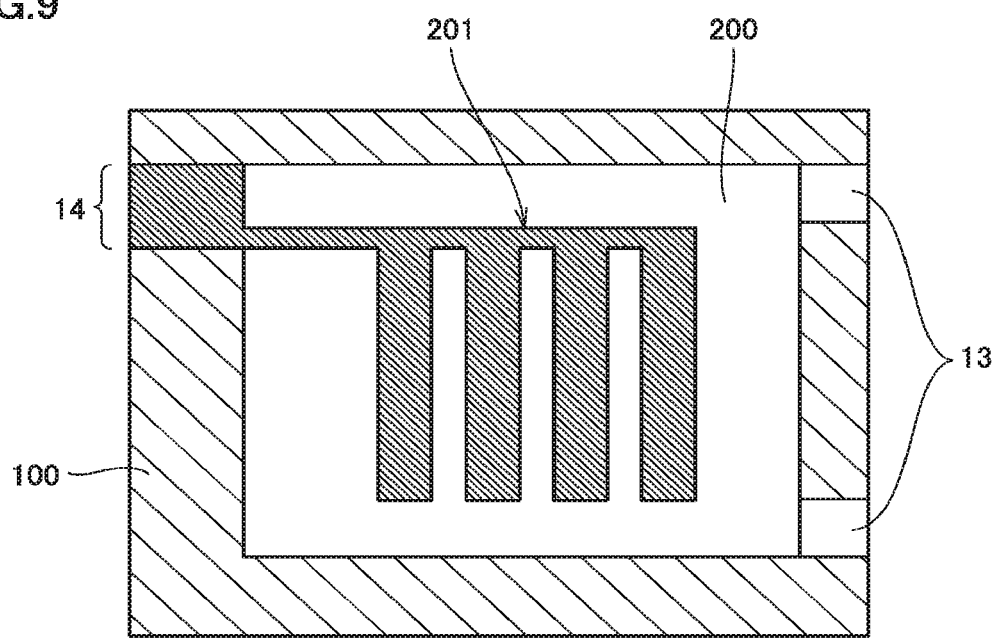
FIG. 9 is a power generating device viewed from the top, after formation of a first transparent electrode.

FIG. 9 is a diagram of power generating device 1 after the formation of first transparent electrode 201, viewed from the top.

As shown in FIG. 9, first transparent electrode 201 can have a comb shape. In this case, first transparent electrode 201 is formed on electret layer 200, extending through insulating layer 12 to support 101. An external draw portion 14 is formed at one end of first transparent electrode 201.

In FIG. 9, electrode 11 has a cathode and an anode which are both extending to one side. External draw portions 13 for electrode 11 are formed on one edge of electrode 11. The shape of electrode 11 and the arrangement of external draw portions 13 for electrode 11 are not limited to the structures described in Embodiment 1. For example, external draw portions 13 may be formed on both sides of photoelectric conversion film 10, or external draw portions 13 may be formed at any other locations.

Figure 10:
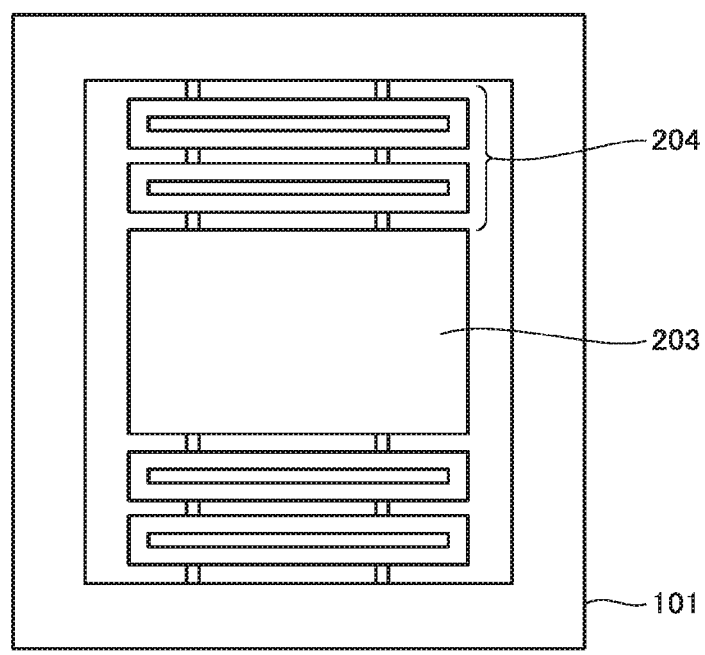
FIG. 10 is a diagram of a light-transmissive movable substrate according to Embodiment 1, viewed from the top.

FIG. 10 is a diagram of light-transmissive movable substrate 203 viewed from the top, according to Embodiment 1.

As shown in FIG. 10, light-transmissive movable substrate 203 is disposed, opposing to first transparent electrode 201. Light-transmissive movable substrate 203 is connected to support 101 through spring 204. Light-transmissive movable substrate 203 and spring 204 are each made by processing a light-transmissive material such as resin or glass. Support 101 does not need to be light transmissive, and thus resin, glass, or silicon, etc. can be used.

Second transparent electrode 202 is formed by depositing or sputtering a light-transmissive metallic oxide, such as zinc oxide, tin oxide, indium oxide, or gallium oxide, onto the surface of light-transmissive movable substrate 203 opposite the first transparent electrode 201, and patterning the light-transmissive metallic oxide. Alternatively, second transparent electrode 202 can be formed to have a desired shape at a deposition phase using, for example, a metal mask.

The shape of second transparent electrode 202 is designed timely optimally, based on the shape of power generating device 1, the density of electric charges of electret layer 200, expected oscillation frequency, and a direction of the oscillation, for example.

Figure 11:
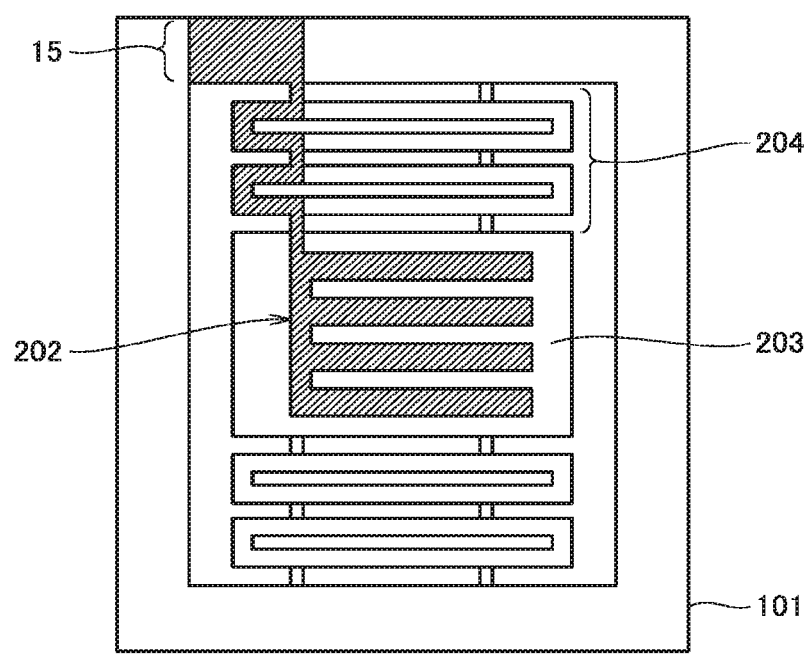
FIG. 11 is a diagram of the light-transmissive movable substrate according to Embodiment 1, viewed from the bottom.

FIG. 11 is a diagram of light-transmissive movable substrate 203 according to Embodiment 1, viewed from the bottom.

As shown in FIG. 11, the shape of second transparent electrode 202 can be formed to a comb shape parallel to a direction X of oscillation of spring 204. In this case, second transparent electrode 202 is formed on light-transmissive movable substrate 203, extending through spring 204 to an edge of support 101. A draw portion 15 for externally drawing current is formed at the edge of support 101.

Output of electret power generator 3 is represented by Equation (2). P indicates the output, A indicates an amount of change in the overlap area between first transparent electrode 201 and second transparent electrode 202, $\sigma$ indicates the density of electric charges of electret layer 200, $d\_1$ indicates the distance between first transparent electrode 201 and second transparent electrode 202, $d\_2$ indicates the thickness of electret layer 200, $\varepsilon\_0$ indicates permittivity of vacuum, $\varepsilon\_1$ indicates relative permittivity of electret layer 200, f indicates oscillation frequency, and n indicates the number of times the first transparent electrode 201 and second transparent electrode 202 overlap.

[MATH 2]

$$P = \frac{A\sigma^2 nf}{4\frac{\varepsilon_1 \varepsilon_0}{d_2}\left(\frac{\varepsilon_1 d_1}{d_2} + 1\right)} \qquad (2)$$

According to Equation (2), in order to increase the output of electret power generator 3, the density of electric charges of electret layer 200 needs to be increased, an amount of change in the overlap area between first transparent electrode 201 and second transparent electrode 202 needs to be increased, or the distance between first transparent electrode 201 and second transparent electrode 202 needs to be reduced.

Here, for example, suppose that power generating device 1 has a size of 20 mm×20 mm, in which the element area of photoelectric conversion film 10 is 18 mm×18 mm, the interface recombination velocity is $1\times10^5$ cm/s, the power generation efficiency is 15%, and the room-light intensity is 400 lux, power obtained by photoelectric conversion unit 2 is 28.4 µW.

Furthermore, conditions are set as follows:

Electret layer 200, having a thickness of 20 nm and a density of interfacial fixed charges of $2.0\times10^{12}$ cm$^{-2}$, is formed above the photoelectric conversion film 10. First transparent electrode 201 and second transparent electrode 202 each have a length of 16 mm and a width of 1 mm. Five first transparent electrodes 201 are disposed 1 mm apart from each other, and five second transparent electrodes 202 are disposed 1 mm apart from each other. The distance between first transparent electrode 201 and second transparent electrode 202 is 200 µm. Moreover, the overlap area between first transparent electrode 201 and second transparent electrode 202 is 0.5 mm$^2$. 10-Hz oscillation is applied to light-transmissive movable substrate 203.

Under these conditions, the maximum power obtained by electret power generator 3 is 52.6 µW, according to Equation (2). On the other hand, although the amount of light incident into photoelectric conversion unit 2 reduces to 95%, the open-circuit voltage and short-circuit current each increase 3% to 4% due to the electric charges of electret layer 200. Thus, the power obtained by photoelectric conversion unit 2 improves to 29 μW, and, together with the power by electret power generator 3, 61.9 μW of output is obtained, without increasing the area of power generating device 1.

As described above, according to the power generating device of the present embodiment, power can be continuously obtained from the electret power generator even if the lights are off and no light incident into photoelectric conversion unit 2 any more. Even if the oscillation stops, on the other hand, power can be still obtained from the photoelectric conversion unit. Thus, the power generating device according to the present embodiment can stably supply power. Moreover, since elements using different environmental energy sources are stacked in the power generating device, the size of the power generating device can be reduced.

Embodiment 2

Figure 12:
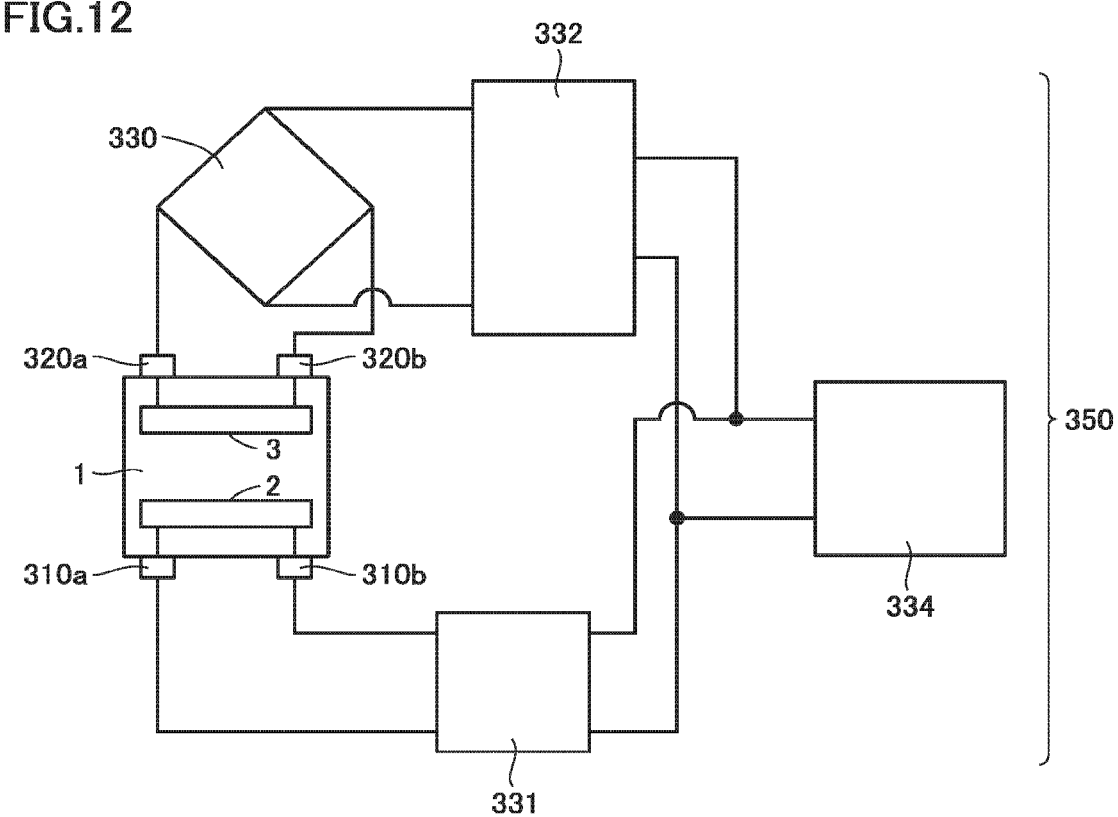
FIG. 12 is a circuit diagram showing a configuration of a power generating module according to Embodiment 2.

FIG. 12 is a circuit diagram showing a configuration of a power generating module 350 according to Embodiment 2.

Power generating module 350 includes a power generating device 1, first output terminals 310a, 310b, second output terminals 320a, 320b, a first DC-to-DC converter 331, a rectifying element 330, a second DC-to-DC converter 332, and a power storage element 334.

Power generated by power generating device 1 is drawn out through first output terminals 310a, 310b and second output terminals 320a, 320b.

First output terminals 310a, 310b output a direct-current (DC) voltage that is generated by photoelectric conversion unit 2 included in power generating device 1.

First DC-to-DC converter 331 converts the DC voltage output from first output terminals 310a, 310b into another DC voltage and outputs the DC voltage obtained from the conversion to power storage element 334.

Second output terminals 320a, 320b output an alternating-current (AC) voltage that is generated by electret power generator 3 included in power generating device 1. Rectifying element 330 rectifies the AC voltage output from second output terminals 320a, 320b.

Second DC-to-DC converter 332 converts the DC voltage output from rectifying element 330 into another DC voltage and sends the DC voltage obtained from the conversion to power storage element 334.

Power storage element 334 may be a lead storage battery, a rechargeable battery such as a lithium-ion battery, or a capacitor such as an electric double layer capacitor. When a rechargeable battery is employed as power storage element 334, power storage element 334 stores electrical energy by chemical reaction, and thus has a benefit of high energy density, which achieves size reduction, and an extended retention period of electric charges, while power storage element 334 may be degraded by repeated charging and discharging. On the other hand, when a capacitor is employed as power storage element 334, electric charges are stored by ionic molecules, and there is thus a benefit of less deterioration of power storage element 334, while the energy density is reduced and self-charge is facilitated. Preferably, power storage element 334 is selected, taking into an account the energy consumption, or an amount of environmental energy source generated and the continuity of the environmental energy source.

With this configuration, even if the supply of power from photoelectric conversion unit 2 and electret power generator 3 within power generating device 1 are both interrupted, the power stored in power storage element 334 can be stably supplied to a device, such as a sensor, communication device, or IC which requires power.

Embodiment 3

Figure 13:
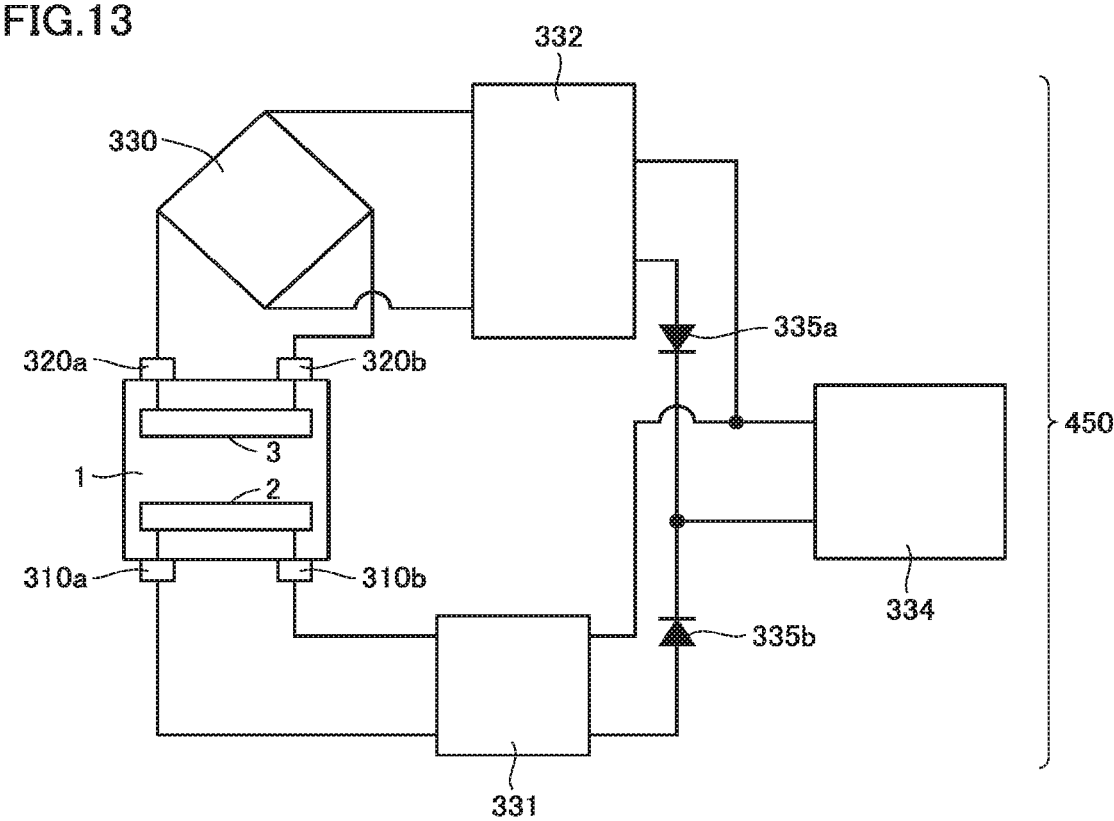
FIG. 13 is a circuit diagram showing a configuration of a power generating module according to Embodiment 3.

FIG. 13 is a circuit diagram showing a configuration of a power generating module 450 according to Embodiment 3.

Power generating module 450 according to Embodiment 3 is different from power generating module 350 according to Embodiment 2, as follows:

Power generating module 450 according to Embodiment 3 includes blocking diodes 335a, 335b.

Power generating device 1, which uses varying environmental energy around it as an energy source, significantly varies in output characteristics with the varying environmental energy. For this reason, the voltage input to power storage element 334 is not always constant. In such a case, reverse flow of current from a circuit included in electret power generator 3 to a circuit included in photoelectric conversion unit 2 or vice versa may occur. If the reverse flow of current occurs, the power generating device is destroyed or an abnormal operation, etc. occurs.

In the present embodiment, a second blocking diode 335a is provided in the middle of the path from electret power generator 3 to power storage element 334, and a first blocking diode 335b is provided in the middle of the path from photoelectric conversion unit 2 to power storage element 334. This can prevent the reverse flow of current, thereby preventing a failure of the power generating module.

Embodiment 4

Figure 14:
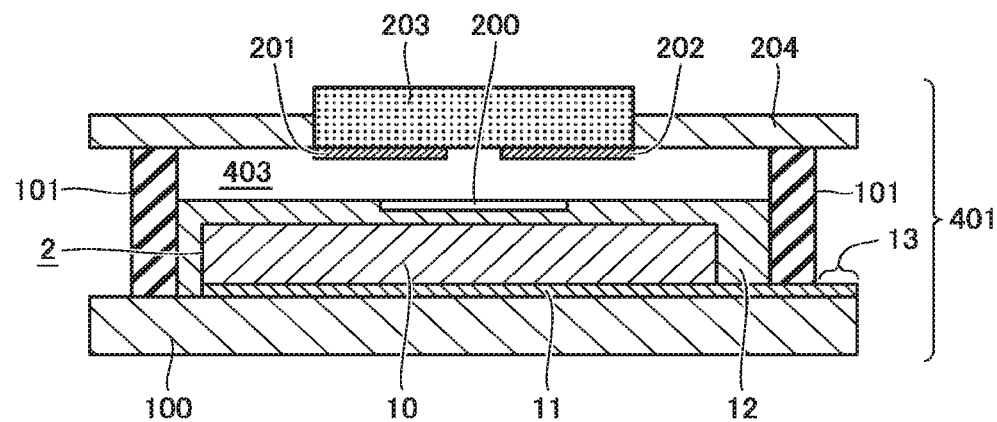
FIG. 14 is a cross section of a power generating device according to Embodiment 4.

FIG. 14 is a cross section of a power generating device 401 according to Embodiment 4.

Power generating device 401 according to Embodiment 4 is different from power generating device 1 according to Embodiment 1 in that power generating device 401 according to Embodiment 4 includes an electret power generator 403 different from electret power generator 3 according to Embodiment 1.

As with electret power generator 3 according to Embodiment 1, electret power generator 403 includes an electret layer 200, a first transparent electrode 201, a second transparent electrode 202, and a light-transmissive movable substrate 203.

Also in Embodiment 4, light-transmissive movable substrate 203 and electret layer 200 are disposed so as to face each other with a space inbetween, as with Embodiment 1. In Embodiment 4, first transparent electrode 201 and second transparent electrode 202 are formed on light-transmissive movable substrate 203.

Figure 15:
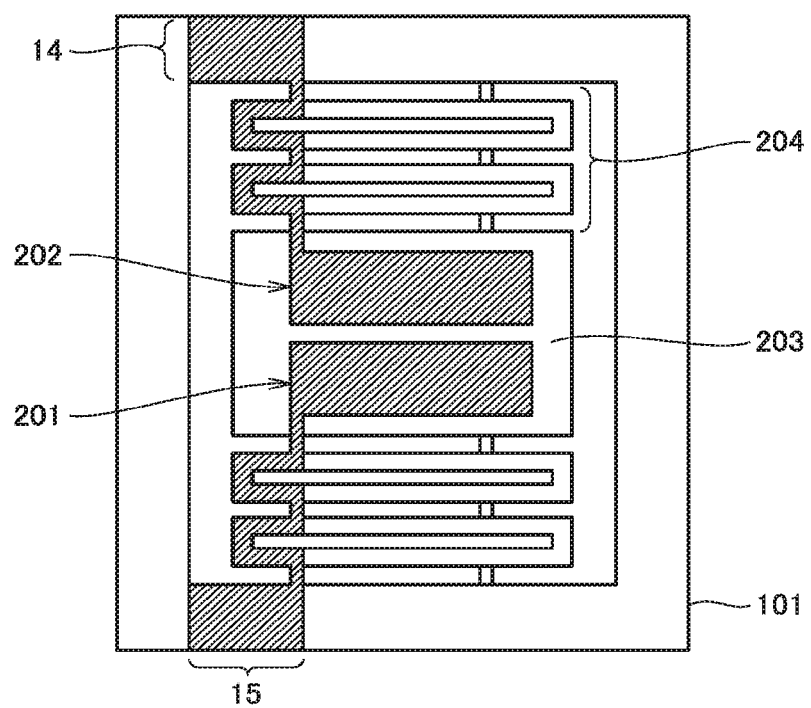
FIG. 15 is a diagram of a light-transmissive movable substrate according to Embodiment 4, viewed from the bottom.

FIG. 15 is a diagram of light-transmissive movable substrate 203 according to Embodiment 4, viewed from the bottom.

As shown in FIG. 15, light-transmissive movable substrate 203 is connected to support 101 through spring 204.

First transparent electrode 201 is formed on light-transmissive movable substrate 203, the first transparent electrode 201 extending through spring 204 to an edge of support 101. A draw portion 14 for drawing the current out of the power generating device is formed at an edge of support 101.

Second transparent electrode 202 is formed on light-transmissive movable substrate 203, the second transparent electrode 202 extending through spring 204 to the edge of support 101. Draw portion 15 for drawing the current out of the power generating device is formed at an edge of support 101.

Figure 16:
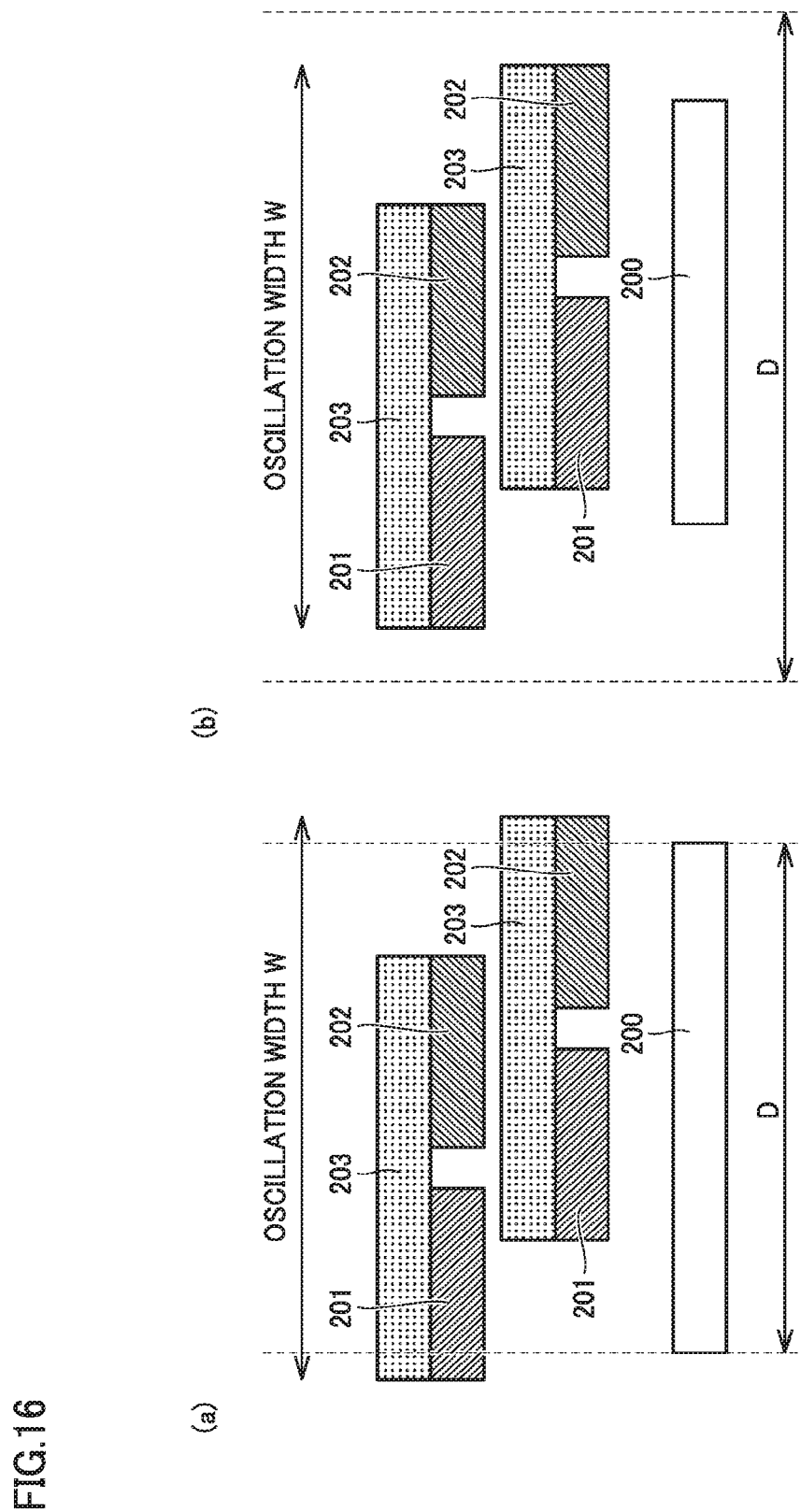
FIG. 16 is a diagram for illustrating a size and arrangement of an electret layer according to Embodiment 4.

FIG. 16 is a diagram for illustrating the size and arrangement of electret layer 200 according to Embodiment 4.

When the entire surfaces of first transparent electrode 201 and second transparent electrode 202 are constantly overlapping with the electret layer during the oscillation of light-transmissive movable substrate 203, electric charges do not transfer, ending up failing to generate power. For this reason, the size and arrangement of electret layer 200 are adjusted so that some of the entire surfaces of first transparent electrode 201 and the second transparent electrode do not overlap with electret layer 200 in a certain period during the oscillation of light-transmissive movable substrate 203.

Specifically, as shown in (a) of FIG. 16, the size and arrangement of electret layer 200 are adjusted so that the distance (also referred to as an oscillation width W) between the left-most position of first transparent electrode 201 and the right-most position of second transparent electrode 202 when light-transmissive movable substrate 203 is oscillating is greater than a width D of electret layer 200.

On the other hand, as shown in (b) of FIG. 16, when oscillation width W is less than width D of electret layer 200, electric charges do not transfer, ending up failing to generate power. Thus, electret layer 200 is not adjusted in such a manner.

Figure 17:
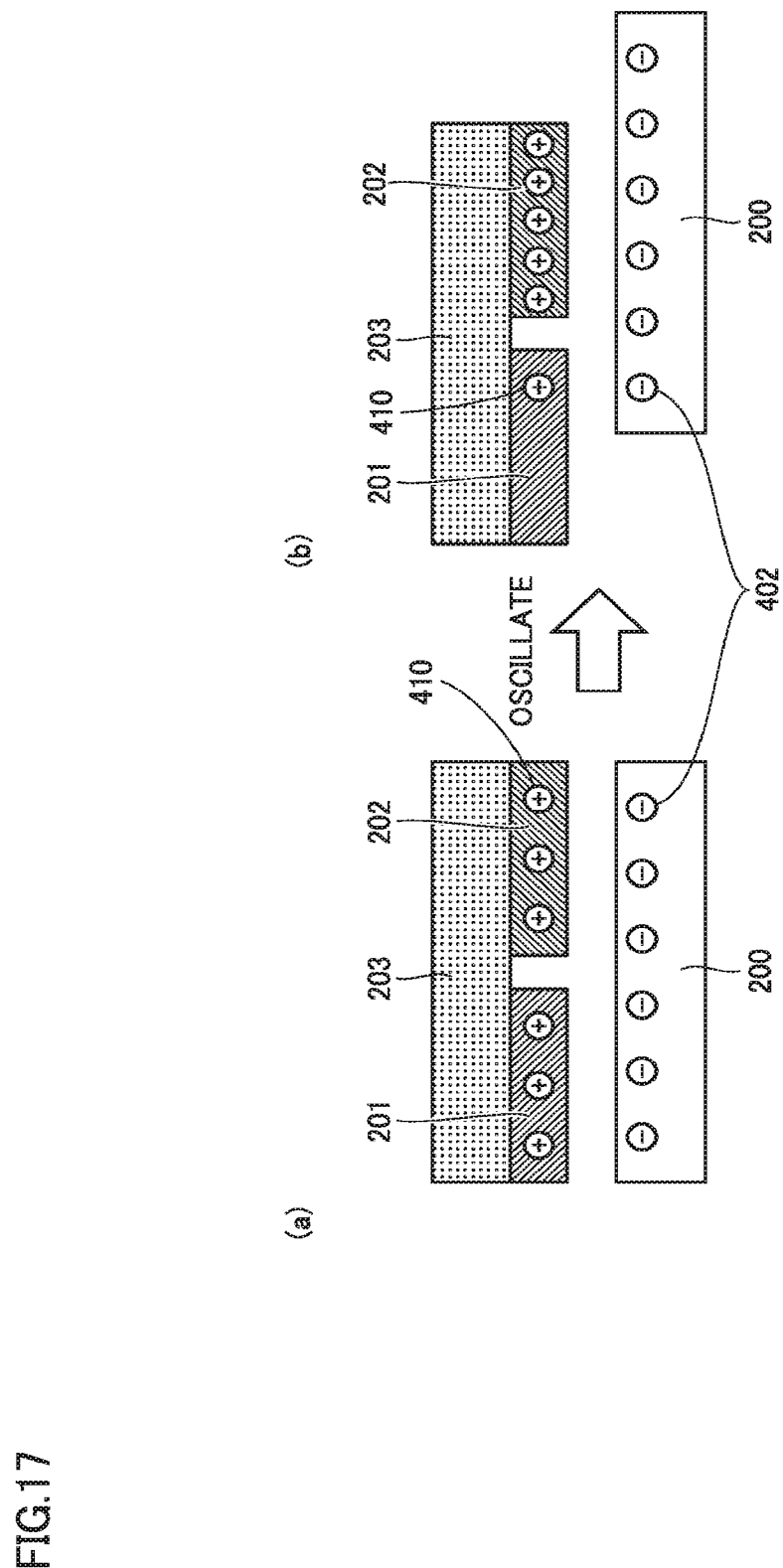
FIG. 17 is a diagram illustrating a power generation operation of an electret power generator according to Embodiment 4.

FIG. 17 is a diagram illustrating a power generation operation of electret power generator 403 according to Embodiment 4.

As shown in (a) of FIG. 17, when both the first transparent electrode 201 and second transparent electrode 202 are overlapping with electret layer 200, positive electric charge 410 is induced equally in first transparent electrode 201 and second transparent electrode 202.

As shown in (b) of FIG. 17, when light-transmissive movable substrate 203 is oscillated and a portion of first transparent electrode 201 does not overlap with electret layer 200, positive electric charge 410 induced in the portion of first transparent electrode 201 transfers to second transparent electrode 202 through an external load. This allows power to be drawn out of the power generating device.

In the present embodiment, first transparent electrode 201 and second transparent electrode 202 can be formed simultaneously on light-transmissive movable substrate 203, thereby simplifying the fabrication process.

Embodiment 5

Figure 18:
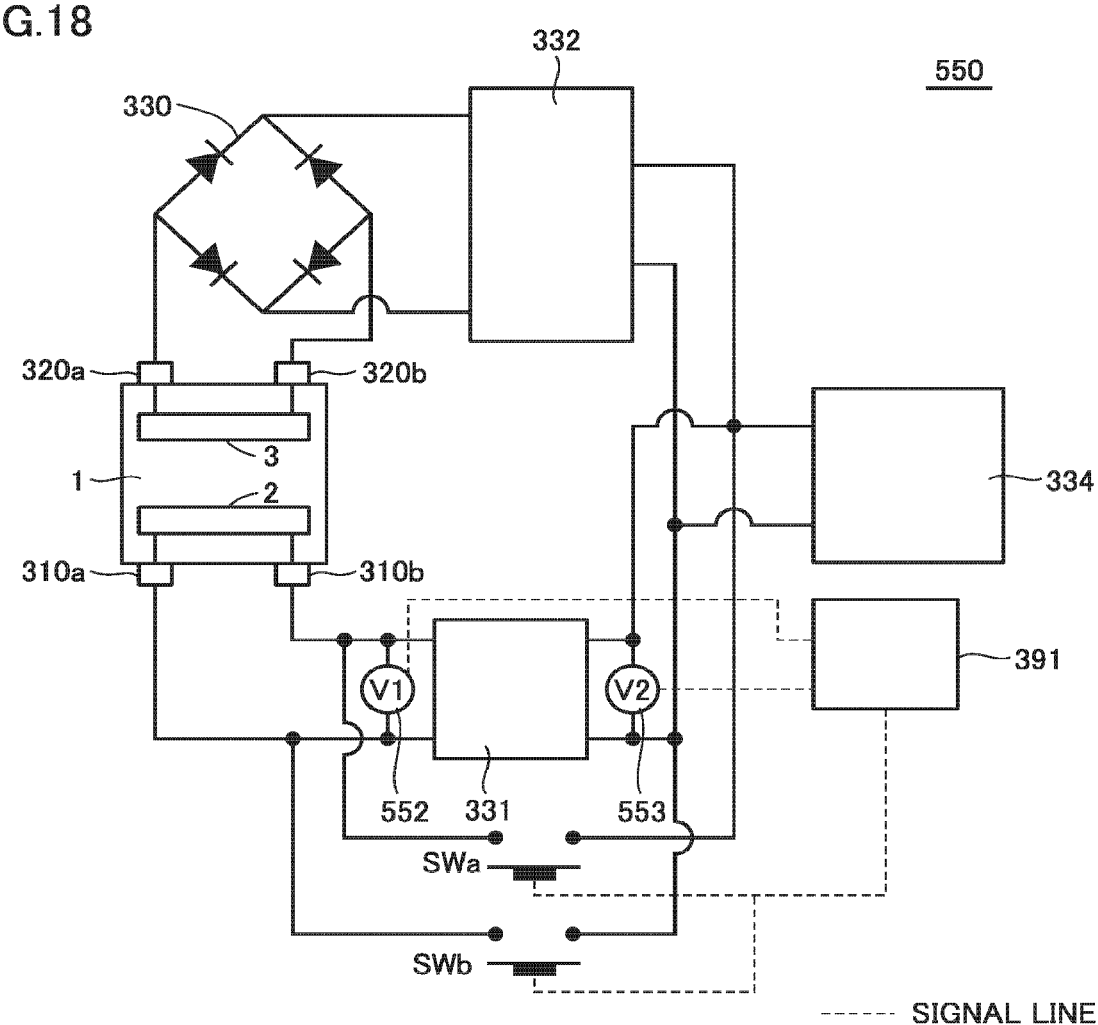
FIG. 18 is a circuit diagram showing a configuration of a power generating module according to Embodiment 5.

FIG. 18 is a circuit diagram showing a configuration of a power generating module 550 according to Embodiment 5.

Power generating module 550 according to Embodiment 5 is different from power generating module 350 according to Embodiment 2, as follows:

Power generating module 550 according to Embodiment 5 includes a circuit controller 391, bypass switches SWa, SWb, and voltage measurement units 552, 553.

Voltage measurement unit 552 measures a voltage V1 between the input terminals of first DC-to-DC converter 331. Voltage V1 represents the output voltage of photoelectric conversion unit 2 within power generating device 1. Voltage measurement unit 553 measures a voltage V2 between the output terminals of first DC-to-DC converter 331. Voltage V2 represents a voltage across power storage element 334.

Circuit controller 391 controls bypass switches SWa, SWb, based on voltage V1 measured by voltage measurement unit 552 and voltage V2 measured by voltage measurement unit 553.

Bypass switch SWa connects or disconnects between one of the input terminals and one of the output terminals of first DC-to-DC converter 331. Bypass switch SWb connects or disconnects another one of the input terminal and another one of the output terminal of first DC-to-DC converter 331.

Power W stored in power storage element 334 is as represented by Equation (3) below, and voltage V2 across the power storage element 334 thus gradually increases during charging. Here, C is capacitance of power storage element 334.

[MATH 3]

$$W = \frac{1}{2} C \cdot V2^2 \quad (3)$$

Accordingly, when no or a little power is stored in power storage element 334, voltage V2 across the power storage element 334 is a low value.

The conversion efficiency of first DC-to-DC converter 331 is about 90% even in an optimal step up ratio, and, generally, decreases with an increase of the step up ratio. Accordingly, if a situation permits that the output voltage of photoelectric conversion unit 2 is sufficiently higher than the voltage of power storage element 334 and the power obtained by photoelectric conversion unit 2 can be charged at power storage element 334 even by directly connecting photoelectric conversion unit 2 to power storage element 334, the power can be stored more efficiently without passing through first DC-to-DC converter 331, because this eliminates the power consumption at first DC-to-DC converter 331. Therefore, when voltage V2 is lower than voltage V1, circuit controller 391 turns on bypass switches SWa, SWb to directly supply power storage element 334 with the output of photoelectric conversion unit 2 within power generating device 1, without passing the output through first DC-to-DC converter 331.

Circuit controller 391 can be configured of a microcontroller having an analog input or a voltage comparator such as a comparator. Considering the power consumption (power consumed when switching, power consumed by elements upon energization), bypass switches SWa, SWb are desirably semiconductor switches such as MOSFET (Metal Oxide Semiconductor Field Effect Transistor).

On the other hand, electret power generator 3 generates a voltage that is relatively high (20V to 30V), as compared to the output voltage of photoelectric conversion unit 2 (solar device). Accordingly, it is desirable to adjust the output of electret power generator 3 to a voltage (3V to 5V) that can be input to sensors or microcontroller which are external loads, by connecting the output of electret power generator 3 to a buck second DC-to-DC converter 332 before connecting electret power generator 3 to power storage element 334.

With the above configuration, in order to charge the power storage element 334 with the power generated by power generating device 1 at an initial state where no power is charged at power storage element 334, if a voltage across power storage element 334 is lower than the output voltage of photoelectric conversion unit 2 which outputs a low voltage, all the power generated by photoelectric conversion unit 2 can be stored in power storage element 334 by directly charging power storage element 334 by photoelectric conversion unit 2, without passing through the first DC-to-DC converter 331. When an increased power is charged in power storage element 334 and the voltage across power storage element 334 increases higher than the output voltage of photoelectric conversion unit 2, power can continue to be charged in power storage element 334 by stepping up the output voltage of photoelectric conversion unit 2 by first DC-to-DC converter 331. With the control as described above, power generating module 550 can supply power in an efficient manner.

(Variation)

The present invention is not limited to the above embodiments, and includes a variation as below, for example.

(1) Photoelectric conversion film 10 is not limited to p-type crystalline silicon. For example, an n-type crystalline silicon, polycrystalline silicon, amorphous silicon, a compound, or an organic photoelectric conversion film 10 can be used.

Photoelectric conversion film 10 is not limited to the backside contact type. Even if photoelectric conversion film 10 includes the electrodes on the light-receiving surface side, similar effects occurs in the comb-shaped electrodes on the light-receiving surface side and in a power generation layer which is the light-receiving portion in a gap between line electrodes. Thus, photoelectric conversion film 10 may be of a PERC (Passivated Emitter Rear Contact) type, PERL (Passivated Emitter Rear Localized) type, heterojunction type, or bifacial.

The embodiments presently disclosed should be considered as illustrative in all aspects and do not limit the present invention. The scope of the present invention is defined by the appended claims, rather than by the above description. All changes which come within the meaning and range of equivalency of the appended claims are intended to be embraced within their scope.

REFERENCE SIGNS LIST 1, 401 power generating device; 2 photoelectric conversion unit; 3, 403 electret power generator; 10, 409 photoelectric conversion film; 11 electrode; 12, 404 insulating layer; 13, 14, 15 power external draw portion; 100 fixing member; 101 support; 200, 410 electret layer; 201 first transparent electrode; 202 second transparent electrode; 203 light-transmissive movable substrate; 204 spring; 310a, 310b, 320a, 320b output terminal; 330 rectifying element; 331, 332 DC-to-DC converter; 334 power storage element; 335a, 335b blocking diode; 350, 450, 550 power generating module; SWa, SWb bypass switch; 391 circuit controller; 552, 553 voltage measurement unit.

The invention claimed is:

1. A power generating module comprising:
a power generating device, including:
a photoelectric converter having a photoelectric conversion film,
an electret power generator formed of a light transmissive material and having an electret layer for holding electric charges, and
an insulating layer which is covering the photoelectric conversion film and transmits light in all wavelength bands available for the photoelectric conversion film or some of the all wavelength bands, the electret layer being stacked on the insulating layer;
a first DC-to-DC converter configured to convert a direct-current voltage output from the photoelectric converter included in the power generating device into another direct-current voltage;
a rectifier circuit configured to convert alternating-current power generated by the electret power generator included in the power generating device into direct-current power;
a second DC-to-DC converter configured to convert a direct-current voltage output from the rectifier circuit into another direct-current voltage; and
a power storage element connected to an output of the first DC-to-DC converter and an output of the second DC-to-DC converter.

2. The power generating module according to claim 1, wherein
the electret power generator includes:
a light-transmissive movable substrate;
a first transparent electrode disposed on the electret layer; and
a second transparent electrode disposed on the light-transmissive movable substrate.

3. The power generating module according to claim 1, wherein
the electret power generator includes:
a light-transmissive movable substrate; and
a first transparent electrode and a second transparent electrode which are disposed on the light-transmissive movable substrate.

4. The power generating module according to claim 1, wherein
the electret power generator is formed of polycarbonate, polypropylene, polytetrafluroethylene, amorphous fluoro resin, or silicon dioxide.

5. The power generating module according to claim 1, wherein
the electret layer is formed of polycarbonate, polypropylene, polytetrafluroethylene, amorphous fluoro resin, or silicon dioxide.

6. The power generating module according to claim 1, wherein
a density of surface charges, regardless of positive or negative, of the electret layer is $1.0 \times 10^{11}$ cm$^{-2}$ or greater.

7. The power generating module according to claim 2, wherein
the light-transmissive movable substrate is connected to a support via a spring, and
the spring is formed of polycarbonate, polypropylene, polytetrafluroethylene, or amorphous fluoro resin.

8. The power generating module according to claim 1, further comprising:
a first blocking diode disposed between the first DC-to-DC converter and the power storage element; and
a second blocking diode disposed between the second DC-to-DC converter and the power storage element.

9. The power generating module according to claim 1, further comprising:
a bypass switch configured to connect or disconnect an input terminal and an output terminal of the first DC-to-DC converter;
a first voltage measurer configured to measure a voltage of the input terminal of the first DC-to-DC converter;
a second voltage measurer configured to measure a voltage of the output terminal of the first DC-to-DC converter; and a circuit controller configured to control the bypass switch, based on the voltage of the input terminal of the first DC-to-DC converter and the voltage of the output terminal of the first DC-to-DC converter.

10. The power generating module according to claim 1, wherein the photoelectric conversion unit includes an electrode, and a surface, which receives no incident light, of the photoelectric conversion film is in contact with the electrode.

* * * * *